United States Patent
Wu et al.

(10) Patent No.: US 6,819,723 B1
(45) Date of Patent: Nov. 16, 2004

(54) DIGITAL FM DEMODULATOR WITH REDUCED QUANTIZATION NOISE

(75) Inventors: Jieh-Tsorng Wu, HsinChu (TW); Hsi-Yuan Wang, HsinChu (TW)

(73) Assignee: National Science Council of Republic of China, Taipei (TW)

( * ) Notice: Subject to any disclaimer, the term of this patent is extended or adjusted under 35 U.S.C. 154(b) by 0 days.

(21) Appl. No.: 09/327,178

(22) Filed: Jun. 7, 1999

(51) Int. Cl.[7] .......................................... H04L 27/156
(52) U.S. Cl. .................. 375/324; 375/316; 375/285; 375/371
(58) Field of Search ................. 375/324, 316, 375/322, 328, 371, 373, 374, 375, 344, 285

(56) References Cited

U.S. PATENT DOCUMENTS

| | | | |
|---|---|---|---|
| 5,465,396 A | * 11/1995 | Hunsinger et al. | ........... 375/232 |
| 5,698,786 A | * 12/1997 | Andersen | ...................... 73/609 |
| 5,700,952 A | * 12/1997 | Andersen | .................... 73/19.03 |
| 5,804,729 A | * 9/1998 | Andersen | ...................... 73/609 |
| 5,831,167 A | * 11/1998 | Andersen | ...................... 73/602 |

* cited by examiner

Primary Examiner—Mohammad H. Ghayour
Assistant Examiner—Pankaj Kumar
(74) Attorney, Agent, or Firm—Rosenberg, Klein & Lee

(57) ABSTRACT

A digital FM demodulator utilizes delay lines as the timing reference and incorporates the concept of delta-sigma analog-to-digital conversion to implement the function of time-to-digital conversion. The FM demodulator is constructed from delay lines, a multiplexer, a phase detector, a charge pump circuit, a quantizer and a digital integrator. The modulated signal on an intermediate frequency carrier passes through the delay lines and is then phase-compared with the original modulation signal. The comparison produces a pulse which is converted into a voltage and stored in a capacitor by way of the charge pump circuit. The voltage having been accumulated and quantized, a new delayed output signal is acquired to compare its phase with the input signal. Meanwhile, the phase difference between input signal and delayed signal is used to select a delay for the delayed signal for the next cycle. The phase difference is continuously evaluated and adjusted to produce zero phase difference. The digital modulation signal is collected at the system output.

11 Claims, 3 Drawing Sheets

DIGITAL FM DEMODULATOR WITH REDUCED QUANTIZATION NOISE

BACKGROUND OF THE INVENTION

1. Field of the Invention

The present invention relates to digital frequency-modulation (FM) demodulation and more particularly, to a digital FM demodulator that extracts a digital time sequence from an intermediate frequency (IF) carrier while reducing quantization error and eliminating a requirement of a reference clock.

2. Description of the Prior Art

Frequency modulation (FM) is an important and common method of information conveyance in radio communication systems. The receiver end of the system contains the FM demodulation circuit which is often of analog including a detector circuit and a phase lock loop (PLL) circuit. Often, the necessary circuitry to implement an FM demodulator is constructed on an integrated circuit chip. If the detector is brought into the integrated circuit, then a larger chip area is required. If the PLL is built into the integrated circuit, then an external capacitor is necessary outside the chip.

If the modulated signal requires digital signal processing after demodulation, then the circuit described above requires an analog-to-digital converter to convert the demodulated analog signal into digital signal. The analog signal is easily interfered with by noise. To reduce noise, the digital FM demodulator will first convert the modulated intermediate-frequency (IF) signal into a digital signal by way of an analog-to-digital converter, thereafter using a digital signal processor to demodulate the modulation signal. The analog-to-digital converter and digital signal processor used in the conventional digital FM demodulator must operate at high speed to demodulate the modulation signal in real time. The system could use a reference clock with a multiple-fold frequency of modulation signal for sampling the input signal to detect its phase change and then demodulate the signal, but such technology requires a high frequency reference clock.

The conventional methods of digital RF communication always need to convert the analog signal into digital signal in the receiver end with the drawbacks of increasing the circuit complexity. Thus, a demodulation circuit combining the detector circuit of a PLL with a carefully chosen analog-to-digital circuit to reduce quantization error could result in accurate demodulation while simplifying circuit design.

SUMMARY OF THE INVENTION

It is therefore a primary objective of the present invention to provide a new digital FM demodulator applicable to radio communication systems such as pagers, cellular phones, Global Positioning Satellite (GPS) systems, and Digital Enhanced Cordless Telecommunication (DECT) systems.

The next object of the present invention is to provide a digital FM demodulator implemented with an analog-to-digital converter. The input intermediate-frequency signal passes through the inventive demodulator thereby generating a digital signal including a high-frequency quantization noise signal. Then, by way of a low-pass filter, the quantized noise signal is filtered to acquire the baseband signal.

A further objective of the present invention is to provide a digital FM demodulator which adapts a PLL structure and utilizes the concept of delta-sigma analog-to-digital conversion which does not require external components or a high frequency reference clock.

The present invention provides advantages over similar systems in the prior art by using delay lines as the timing reference and by adapting the concept of delta-sigma analog-to-digital conversion to achieve the time-to-digital conversion of digital FM demodulation. This digital FM demodulator includes delay lines, an m-to-1 multiplexer, a phase detector, a charge pump circuit, a quantizer and a digital integrator. The modulation signal on an intermediate frequency carrier passes through the delay lines, each having a delay time of around one cycle time, and the phase of the delayed signal is compared with the phase of the original signal. This comparison produces a pulse which is applied to the charge pump circuit where a cumulative charge is stored in a capacitor. This charge is quantized into a voltage level which is accumulated by the digital integrator. Then, a new sample of another output signal of the delay lines is taken and compared in phase with the input signal. This system is similar to a PLL, i.e., it is a feedback system taking phase as the error signal. The quantized digital signal will feed through the low-pass filter defined by the sampling rate if the system to filter out high frequency noise and get the original modulation signal, i.e., the modulation signal is the digital output signal.

BRIEF DESCRIPTION OF THE DRAWINGS

The drawings disclose an illustrative embodiment of the present invention, which serve to exemplify the various advantages and objects thereof, and are as follows.

DETAILED DESCRIPTION OF THE PREFERRED EMBODIMENT

Figure 1:
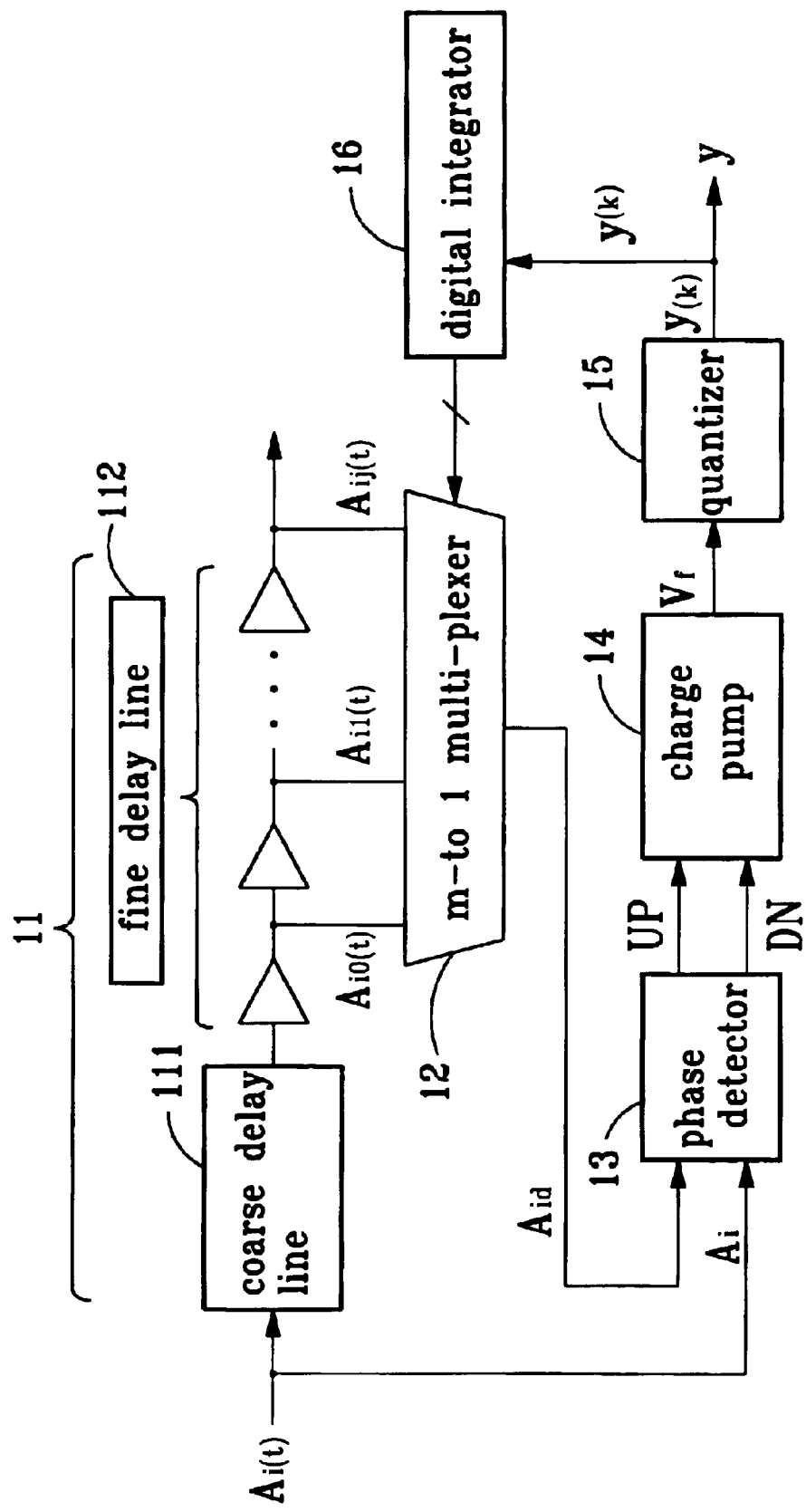
FIG. 1 is the circuit block diagram of the digital FM demodulator according to the present invention.

Please refer to FIG. 1, which illustrates the circuit block diagram of the digital FM demodulator. The modulation signal, Ai(t), is fed into reference delay lines 11, said reference delay lines 11 including coarse delay line 111 and fine delay line 112. The delay times of delay lines 111 and 112 are controlled separately by other circuits. The fine delay lines 112 have multiple output signals Ai1(t), Ai2(t), Ai3(t) ... Aij(t) which could be expressed as follows:

$$Aij(t)=Ai(t-Tc-j*\tau),$$

where,

Tc is the total fixed delay time of the coarse delay lines, and $\tau$ is the unit delay time of fine delay lines.

The m-to-1 multiplexer 12 selects one of the output signals Ai0(t), Ai1(t), Ai2(t), ..., Aij(t) from fine delay lines 112 as delayed signal, Aid. The phase detector 13 compares the phase difference between Aid and Ai, then generates an up or down signal. If the rising edge of Aid leads the Ai signal, the up signal will be generated as an effective pulse having a pulse width equivalent to the time difference between the rising edges of Ai and Aid, and the down signal will not be generated. The total delay time impressed on the Ai signal by passing through the delay lines is "Tc+d*$\tau$", and the pulse width will equal to "T−Tc−d*$\tau$" where d is the number of fine delay lines and "Tc+d*$\tau$" is smaller than period T of the Ai signal. Similarly, if the rising edge of Aid lags the Ai signal, a down signal pulse having a pulse width equal to the time difference of Aid and Ai, i.e., the pulse width will be equal to "Tc+d*τ−T".

The phase detector output value is considered positive when Aid leads the Ai signal, while its value is considered negative when Aid lags the Ai signal. The pulses of the up and down signals are applied to trigger the charge pump circuit 14 for charging and discharging a capacitor, Cc, which generates a voltage difference, Vf, the voltage level of which is proportional to the time difference or phase difference of the Aid and Ai signals. Each cycle of the modulated input signal will generate a Vf which is accumulated in storage capacitor Cc. The stored voltage will be quantized by quantizer 15 to generate a bit stream digital signal y(k), which is the output digital sequence of the total system.

Quantizer 15 is a analog-to-digital converter which may be a one-bit or multiple-bit converter. A one-bit converter may be implemented by a voltage comparator. In the preferred embodiment, the quantizer 15 is a one-bit voltage comparator.

Digital integrator 16 accumulates the output digital signal y(k). In the preferred embodiment, digital integrator 16 is an up-down counter taking the output of quantizer 15 as its input. The counter output signal will select one output Aid signal from the fine delay lines by way of multiplexer 12. Thus, the delay time of the Aid signal is controlled by output signal y(k). The applied delay will be increased by one unit time if y(k)=1. Conversely, the delay of Aid will decrease one unit delay if y(k)=0. Thus, the system functions similarly to a PLL. The output signal y(k) is fed back to adjust the Aid delay time and make the next rising edge of Ai signal arrive at phase detector 13 simultaneously with the rising edge of Aid. The Aid signal is delayed by one cycle of the Ai signal when the system is locked.

Figure 2:
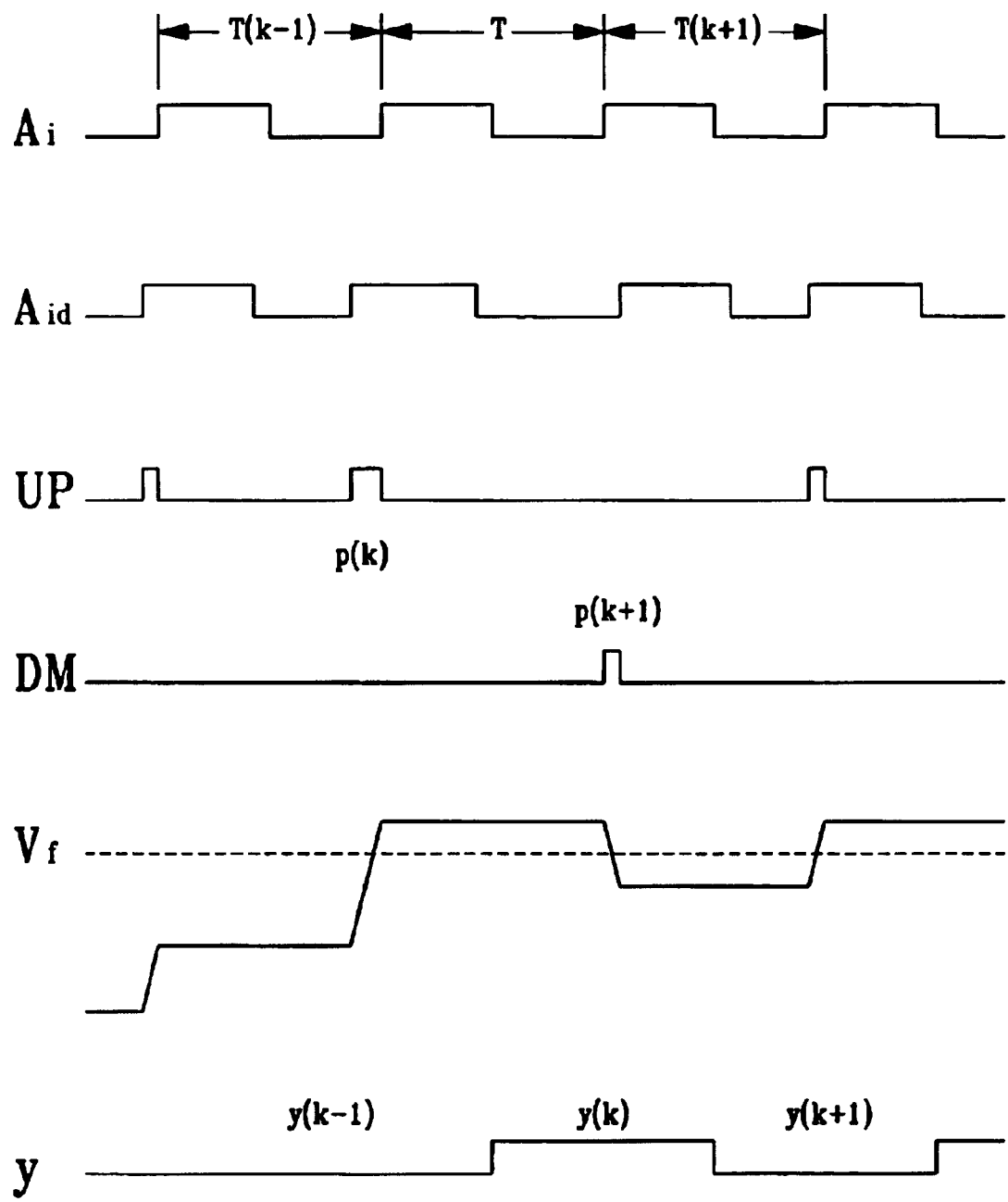
FIG. 2 is the circuit waveform of the digital FM demodulator according to the present invention.

Referring to FIG. 2, the circuit waveforms of the digital FM demodulator according to the present invention are shown. T(k) is the kth cycle time of the modulated input signal and P(k) is the time difference of rising edge of Aid and the next Ai cycle. The effective pulse of the up signal means P(k) is a positive value, and the down signal makes P(K) negative. Because the maximum frequency shift of input modulation signal is much smaller than carrier frequency, the change of T(k) is small relative to carrier cycle Tc. The effective pulse of the up signal and the down signal only happens at the rising edge of Aid and Ai signals and the effective pulse is transferred to Vf in storage capacitor Cc by way of charge pump circuit 14 before the arrival of the falling edge. The falling edge of Ai could be used as the trigger clock of the quantizer 15 and counter 16. Thus, the system does not require an external referenced clock.

Using the waveform diagram of FIG. 2, a formula may be developed as follows:

$$P(k+1)=P(k)+T(k)-T(k-1)+y(k)*\tau,$$

where $$\Delta T(k)=T(k)-T(k-1).$$

Therefore, we could get $$P(k+1)=P(k)+\Delta T(k)+y(k)*\tau.$$

If V(k) is the capacitor voltage at the kth cycle as shown in FIG. 2, we could see V(k) signal is generated by V(k−1) and an Ic signal to charge/discharge Cc during up or down signal effective pulse period and an Ib to charge/discharge Cc during kth cycle, i.e., the voltage is determined by three parameters. The change in voltage on Cc for Ic at kth cycle is:

$$\Delta Vf\_a=Ic/Cc*P(k).$$

If the trigger clock is the input modulation signal Ai, then the change in the Cc when charge-discharge is at the kth cycle will be, $$\Delta Vf\_b=y(k)*Ib/Cc*[T(k)+T(k+1)]/2.$$

Then, $$\Delta Vf=\Delta Vf\_a+\Delta Vf\_b,$$

$$V(k+1)=V(k)+\{y(k)*(Ib/Cc)*[T(k)+T(k+1)]/2\}+\{Ic/Cc*P(k)\}.$$

Because the maximum frequency shift is much smaller than carrier frequency, the T(k) is approximately equal to carrier cycle Tc and $$V(k+1)=V(k)+Ic/Cc*P(k)+y(k)*(Ib/Cc)*Tc.$$

Assume A=Ic/Cc and B=(Ib/Cc)*Tc. Then, $$V(k+1)=V(k)+A*P(k+1)+B*y(k).$$

Inserting P(k+1) into the above formula, we get $$V(k+1)=V(k)+A*[P(k)+\Delta T(k)+y(k)*\tau]+B*y(k)$$

The quantized output of V(k), y(k) is the total system output.

Figure 3:
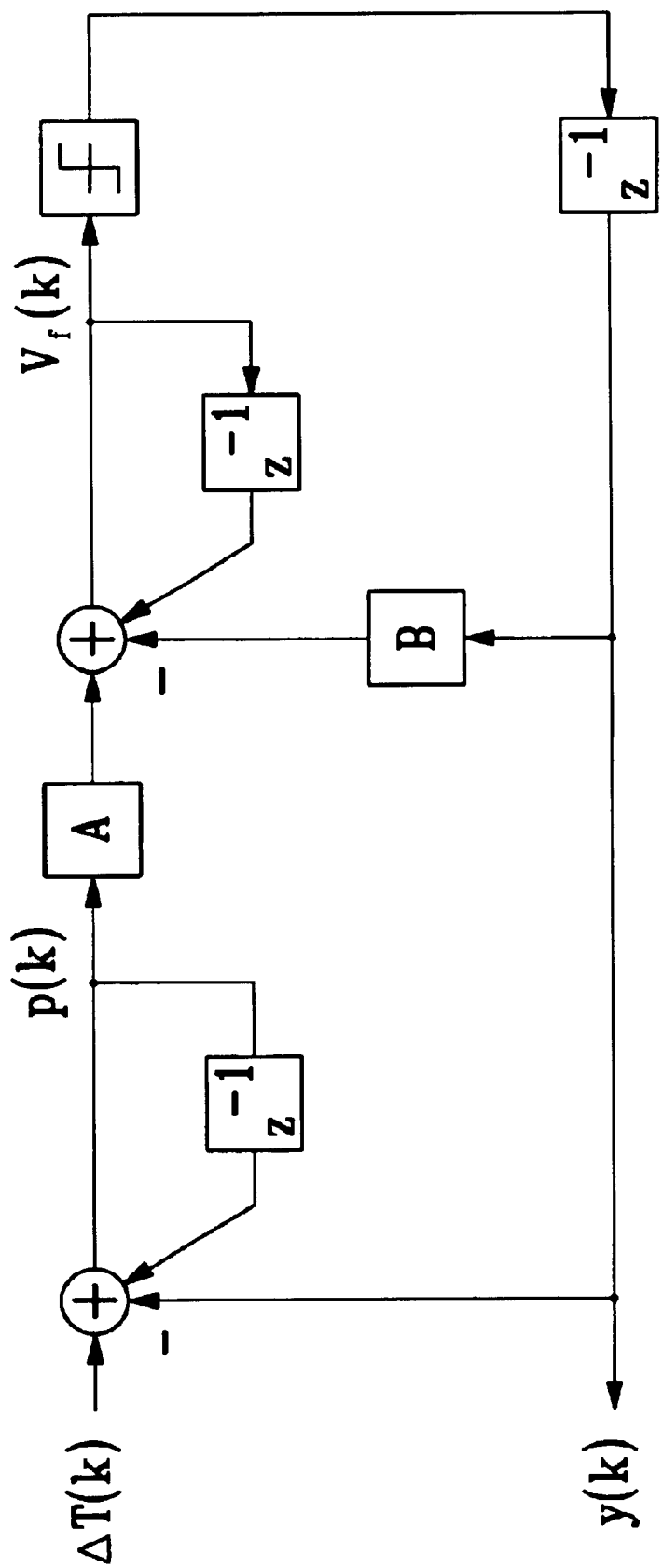
FIG. 3 is the system structure of the digital FM demodulator according to the present invention.

Referring to FIG. 3, the system structure of digital FM demodulator according to the present invention is shown. This diagram illustrates a two level delta-sigma structure developed from the analysis above. The input is ΔT(k), the signal difference of T(k) and T(k−1).

In concept, the output signal, y(k), of the present invention is similar to a conventional analog-digital converter output signal. In both systems, the quantized noise signal is shifted into the high frequency region. However, in conventional systems, the output digital signal y(k) is first accumulated and then filtered from quantized noise by a digital filter to get the modulation signal. This technology is similar to conventional delta-sigma analog-to-digital converters. As shown above, the output digital signal is produced by differentiation of the original modulation signal. In the system of the present invention, the y(k) signal is filtered out of the quantized noise by way of a low-pass digital filter before signal accumulation.

The present invention provides an FM digital demodulator with advantages over conventional technology as follows:

1. The method and circuit of the present invention is applicable in radio communication systems, such as pagers, cellular phones, GPS systems, and DECT systems.

2. The present invention provides a digital modulation demodulator which adapts a PLL structure and utilizes the concept of delta-sigma analog-to-digital converter without requiring external components or a high frequency reference clock so as to allow ease of integration.

3. The present invention provides a digital modulation demodulator with the functions of demodulation and analog-to-digital conversion. The input of intermediate-frequency signal passes through the inventive demodulator and generates a digital signal including high-frequency quantization noise. Then, by way of an inherent low-pass filter, the quantized noise signal is filtered to acquire the baseband signal.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A digital FM demodulator comprising:

a segmented delay line coupled to a modulated input signal, said segmented delay line including a course delay line series-coupled to a fine delay line, said fine delay line being a tapped delay line having a plurality of fixed delay elements coupled respectively to a corresponding plurality of tap lines;

a multiplexer having one output line and a plurality of input lines, wherein each of said plurality of input lines is coupled to a respective one of said plurality of tap lines and said output line conveys a delayed input signal;

a phase detector coupled to said modulated input signal and said delayed input signal, said phase detector configured to produce an output pulse at an output port thereof proportional in width to a relative phase difference between said modulated input signal and said delayed input signal, said output pulse being produced in a first state when said modulated input signal leads in phase said delayed input signal and said output pulse being produced in a second state when said modulated input signal lags in phase said delayed input signal;

a charge integrator coupled to said output port of said phase detector, said charge integrator configured to produce an accumulation signal at an output terminal thereof proportional to an amount of stored charge accumulated through a plurality of output pulses received over time from said phase detector, wherein receiving said output pulse in said first state removes charge from said charge integrator by an amount proportional to said width of said output pulse and receiving said output pulse in said second state adds charge to said charge integrator by an amount proportional to said width of said output pulse;

a quantizer coupled to said charge integrator, said quantizer configured to produce a digital output signal at an output terminal thereof, wherein said digital output signal is made to change state when a level of said accumulation signal crosses a predetermined reference signal level; and a digital integrator coupled to said digital output signal, wherein said digital integrator is coupled to said multiplexer for selectively applying a delay proportional to said state of said digital output signal to said modulated input signal to produce said delayed input signal.

2. The digital FM demodulator as recited in claim 1, wherein said quantizer is an analog-to-digital converter.

3. The digital FM demodulator as recited in claim 2, wherein said analog-to-digital converter is a one-bit analog-to-digital converter.

4. The digital FM demodulator as recited in claim 1, wherein said quantizer is a voltage comparator.

5. The digital FM demodulator as recited in claim 1, wherein said digital integrator is a digital up/down counter.

6. The digital FM demodulator as recited in claim 1, wherein said digital integrator increases said delay if said state of said digital output signal is a logical one (1).

7. The digital FM demodulator as recited in claim 1, wherein said digital integrator decreases said delay if said state of said digital output signal is a logical zero (0).

8. The digital FM demodulator as recited in claim 1, wherein said output port of said phase detector includes a first conductor for transmitting said output pulse in said first state and a second conductor for transmitting said output pulse in said second state.

9. The digital FM demodulator as recited in claim 1, wherein each of said quantizer and said digital integrator includes a triggering mechanism for holding an output signal level upon receiving a trigger signal applied thereto.

10. The digital FM demodulator as recited in claim 9, wherein said triggering mechanism of each of said quantizer and said digital integrator is coupled to said modulated input signal.

11. The digital FM demodulator as recited in claim 10, wherein said triggering mechanism of each of said quantizer and said digital integrator is activated on a falling edge of said modulated input signal.

* * * * *